United States Patent [19]

Huntington

[11] 4,229,730
[45] Oct. 21, 1980

[54] MODIFIED DUAL-SLOPE ANALOG TO DIGITAL CONVERTER

[75] Inventor: Robert C. Huntington, Phoenix, Ariz.

[73] Assignee: Motorola, Inc., Schaumburg, Ill.

[21] Appl. No.: 7,064

[22] Filed: Jan. 29, 1979

Related U.S. Application Data

[63] Continuation of Ser. No. 666,528, Mar. 12, 1976, abandoned.

[51] Int. Cl.$^3$ .......................................... H03K 13/20
[52] U.S. Cl. .......................... 340/347 NT; 324/99 D; 340/347 CC; 340/347 AD; 340/347 M
[58] Field of Search .................. 340/347 AD, 347 CC; 324/99 D

[56] References Cited

U.S. PATENT DOCUMENTS

| | | | |
|---|---|---|---|
| 3,445,839 | 5/1969 | Engelberg et al. | 340/347 CC |
| 3,541,446 | 11/1970 | Prozeller | 340/347 NT |
| 3,667,055 | 5/1972 | Uchida | 340/347 CC |
| 3,824,588 | 7/1974 | Vermillion | 340/347 AD X |
| 3,872,466 | 3/1975 | Wold | 340/347 NT |
| 3,942,173 | 3/1976 | Wold | 340/347 NT |
| 3,958,236 | 5/1976 | Kelly | 340/347 CC X |
| 3,978,471 | 8/1976 | Kelly | 340/347 CC X |

Primary Examiner—Thomas J. Sloyan
Attorney, Agent, or Firm—Anthony J. Sarli, Jr.

[57] ABSTRACT

A method and an apparatus are disclosed for converting an analog input signal having either a positive or negative polarity into a digital output signal indicating the magnitude and polarity of the input signal. Amplifier offset voltages and dynamic hysteresis in the comparator are compensated automatically and a zero reference is established automatically to provide a corrected output. A compensation capacitor and an integrating capacitor are selectively charged. A reference signal is integrated to measure the magnitude of the difference between the integrator offset voltage and the comparator threshold. A digital representation of the time required to measure the difference between the integrator offset voltage and the comparator threshold is stored. The compensation capacitor and the integrating capacitor are again selectively charged. The analog input signal is then integrated for a fixed time. The reference signal is integrated for a time equivalent to the digitally stored time. The time required to continue the integration of the reference signal to a predetermined voltage is then measured. The measured time is converted into a digital output signal representative of the magnitude and polarity of the analog input signal.

1 Claim, 8 Drawing Figures

MODIFIED DUAL-SLOPE ANALOG TO DIGITAL CONVERTER

This is a continuation of Ser. No. 666,528, filed Mar. 12, 1976, now abandoned.

BACKGROUND OF THE INVENTION

This invention relates to analog-to-digital (A/D) converters, and more particularly, to modified dual-slope A/D converter systems which can be integrated on a single all-CMOS chip.

The most sophisticated prior art A/D converters typically are constructed on a minimum of two integrated circuit chips, require an external clock input, and are connected to numerous off chip capacitors, resistors and diodes. Frequently these off chip components must either be matched or of the high precision variety. While some of these prior art A/D converters may have an autopolarity feature whereby the converter automatically senses and adjusts to either a positive or negative input polarity, virtually all of them require a manual zero and full scale calibration prior to each measurement. Additionally these circuits are often highly temperature sensitive so that for any change in operating temperature there must be a manual recalibration. Another difficulty often inherent in these prior art devices is that they require an undesirably high current drain from either the unknown input signal or from the reference voltage source.

The present invention provides an A/D converter which is totally constructed on a single CMOS integrated circuit chip. A self-contained clock is included on the chip. The system has both autopolarity and autozero features, whereby either positive or negative input voltages are accepted for measurement. Only a single reference voltage is required. During each A/D conversion cycle the system automatically compensates for the offset voltage in each of its two op amps and eliminates error due to comparator hysteresis. This latter group of features totally eliminates any necessity for an operator to make manual adjustments while using the A/D converter system. Drifts in op amp offset voltages and comparator threshold are major factors causing temperature related errors in A/D converters. The present system avoids these errors by updating the corrections for these effects during each conversion cycle. The system also excludes comparator hysteresis or lag as an error producing factor by causing the comparator threshold always to be approached by ramp voltage having a constant slope and polarity. The system has an inherently high input impedance requiring less than a one nanoamp current drain from either the input signal or from the reference voltage source. This single chip A/D converter system requires only two external resistors and two external capacitors to be complete. None of these four external discrete components must be matched or of the high precision variety. The system will accept a wide range of external power supply voltages and draws a supply current of less than two milliamperes when supply voltages are ±5 V.

SUMMARY OF THE INVENTION

It is an object of this invention to provide an A/D converter system having a resolution of 3½ digits or more and an accuracy of at least 0.05 percent of the full scale reading.

It is another object of this invention to provide an A/D converter system having an input resistance greater than $10^9$ ohms and requiring less than a one nanoamp current drain from either the unknown input signal or reference voltage source.

It is still another object of this invention to provide an A/D converter system having both autopolarity and autozero features.

Another object of this invention is to provide an A/D converter system which is self-correcting for the effects of amplifier offsets, comparator threshold, and comparator dynamic hysteresis.

It is a still further object of this invention to provide an A/D converter system requiring only four noncritical off chip components and which has excellent temperature stability.

Briefly stated, and in accordance with one embodiment of the invention, an A/D converter is provided for converting an analog input signal into digital output signals. The A/D converter includes input means composed of a plurality of analog means having internal analog error voltages associated therewith, and means for receiving a reference signal. The input means is responsive to the analog input signal and the reference signal for selectively storing and discharging energy. The A/D converter further includes control means and digitizing means coupled to the input means and responsive to the input means for selectively removing the internal analog error voltages and for generating digital output signals representative of the magnitude and polarity of the analog input signal.

BRIEF DESCRIPTION OF THE DRAWINGS

The invention is pointed out with particularity in the appended claims, however, other objects and advantages, together with the operation of the invention, may be better understood by reference to the following detailed description taken in connection with the following illustrations:

FIG. 3 is a truth table indicating the switch closures for the linear subsystem circuit shown in FIG. 2.

DETAILED DESCRIPTION OF THE INVENTION

In order to better illustrate the advantages of the invention and its contribution to the art, a preferred hardware embodiment of the invention will now be described in detail.

Figure 1:
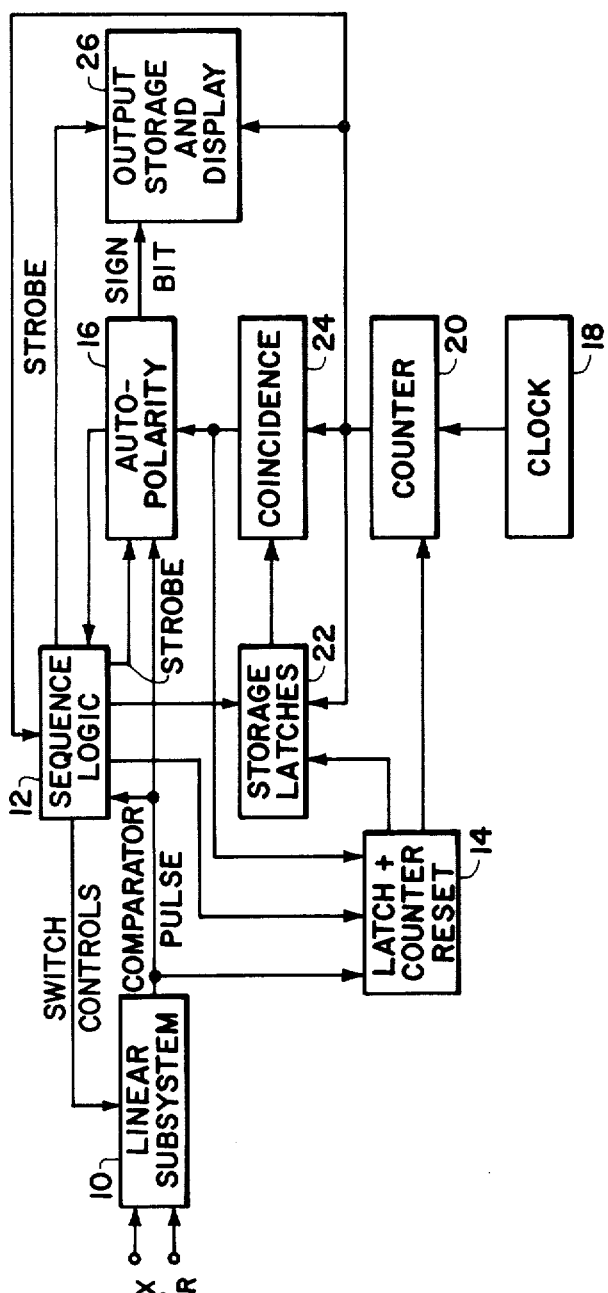
FIG. 1 is a functional block diagram showing the individual logical elements of the 3½ digit A/D converter.

The A/D converter system in accordance with the invention, as illustrated in FIG. 1, includes a linear subsystem 10 which receives and processes the unknown incoming signal $V_X$ and the reference voltage $V_R$. Linear subsystem 10 receives switch control signals from the sequence logic unit 12. Periodically the linear subsystem 10 generates a comparator pulse output signal which is coupled to the sequence logic unit 12, a latch and counter reset unit 14 and to an autopolarity unit 16. A clock 18 generates a timing signal which is coupled to a counter 20; these two elements constitute the counter means. The output of counter 20 is coupled to a set of storage latches 22, a coincidence unit 24, an output storage and display unit 26, and a sequence logic unit 12. The output of latch and counter reset unit 14 is coupled to the counter 20 and the storage latches 22. Latch and counter reset unit 14 receives input signals from linear subsystem 10, coincidence unit 24 and the sequence logic unit 12. Autopolarity unit 16 receives an additional input signal from sequence logic unit 12 and generates a first output signal which is coupled to sequence logic unit 12 and a second sign bit output signal which is coupled to the output storage and display unit 26. The output storage and display unit 26 also receives a strobe input signal from sequence logic unit 12.

Figure 2:
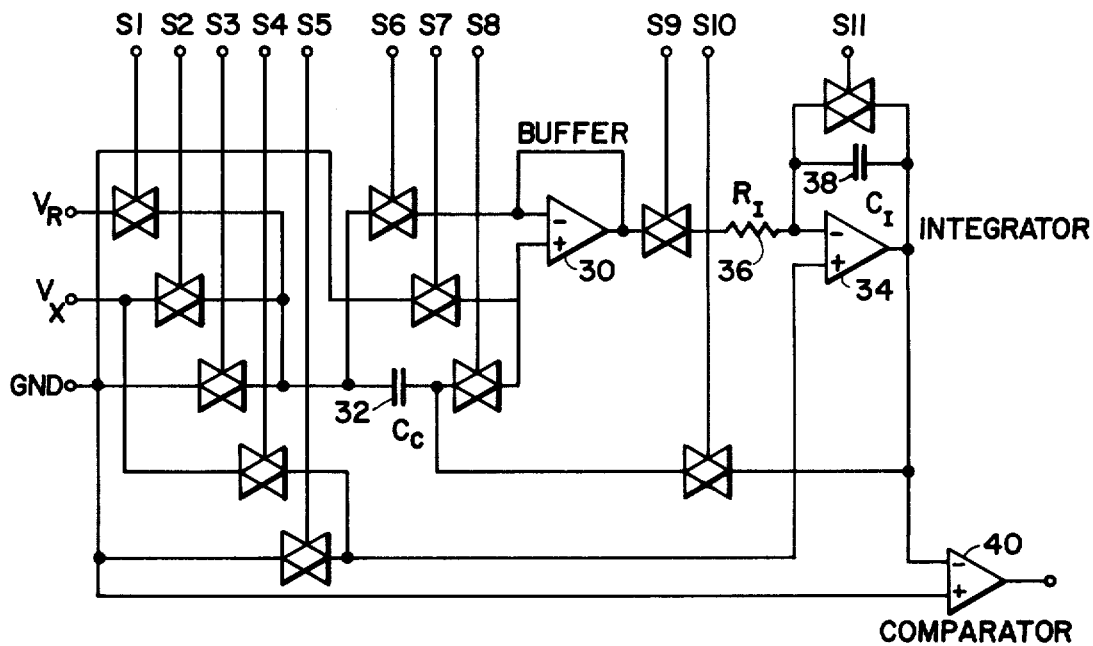
FIG. 2 is a circuit diagram of the linear subsystem of the A/D converter.

A more detailed breakdown of the linear subsystem 10 or input means is shown in FIG. 2. Linear subsystem 10 includes a plurality of transmission gates or logic means S1, S2, S3, ..., S11. Linear subsystem 10 further consists of a plurality of analog means including buffer amplifier 30, compensating capacitor $C_c$ (32), integrator resistor $R_I$ (36), integrator capacitor $C_I$ (38), integrator amplifier 34 and comparator 40.

FIG. 3 is a truth table indicating the status of the transmission gate switches S1, S2, S3, ..., S11 of linear subsystem 10 for timing cycles 1 through 6, the operation of which will be described shortly.

Buffer amplifier 30 has an input offset voltage $E_{Bos}$. Integrator op amp 34 has an input offset voltage $E_{ios}$. Comparator 40 has an input offset voltage $E_{cos}$. All noninverting amplifier inputs are shown by a "+" while all inverting amplifier inputs are shown by a "−".

A characteristic common to all op amps is that they have input offset voltages which vary with temperatures and which differ from unit to unit. Usually means are provided for manually zeroing this offset by adjusting a pot. In the A/D converter of the present invention offset voltages in the buffer and integrator op amps 30 and 34 have the effect of being added directly to the input signal and producing large system errors unless they are nulled. In this system both buffer and integrator op amp offsets are compensated automatically during each conversion cycle in a manner which will be described.

Figure 4:
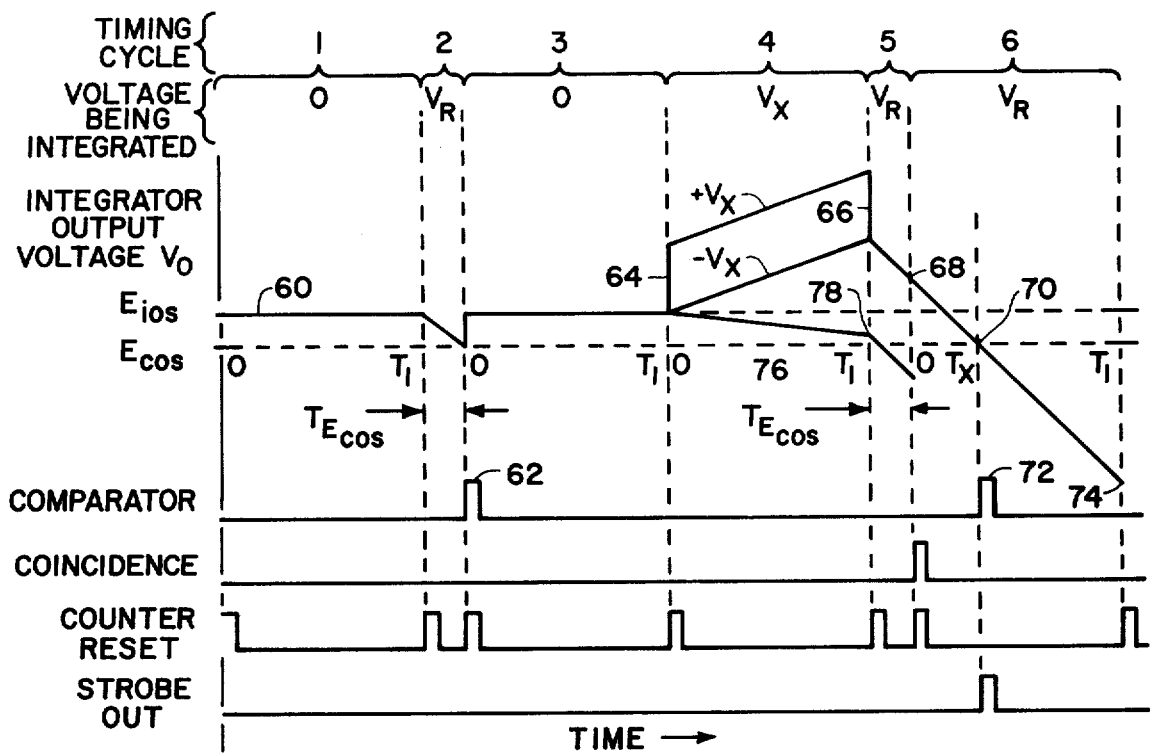
FIG. 4 is a timing diagram indicating the method of operation of the apparatus shown in FIG. 1.

FIG. 4 is an operation sequence diagram which shows the integrator output voltage waveform 60 plotted as a function of time during each of the six timing cycles which constitute one complete A/D conversion cycle. At the bottom of FIG. 4 the timing relationships of the comparator, coincidence, counter reset, and strobe output pulses are shown.

For each of the six timing cycles the linear subsystem 10 assumes a configuration determined by the switch closures listed in FIG. 3. To clarify the effects of the switch settings the resulting effective circuit configurations of the linear subsystem 10 for each timing cycle are shown in FIG. 5 in which $V_R$ is the reference voltage, $-V_X$ and $+V_X$ are the negative and positive input voltages, and $V_O$ is the integrator output voltage which is coupled directly into the inverting input of the ground-referenced comparator 40 in all cases. There are two cycle 4 configurations of which cycle 4− is used for a negative input signal ($-V_X$) and cycle 4+ is used for a positive input signal ($+V_X$).

Figure 5A:
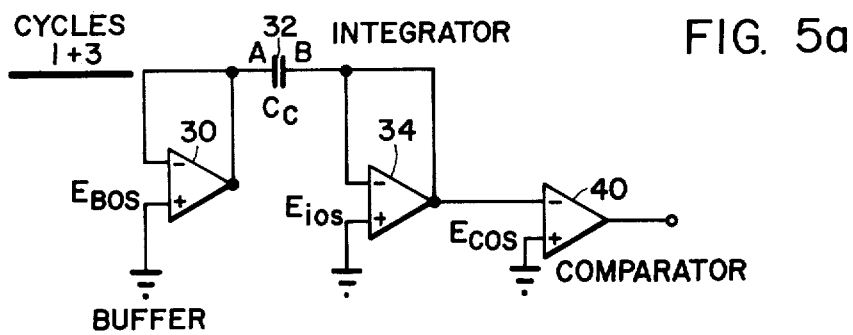
FIG. 5(a-d) shows a schematic representation of the effective linear subsystem configurations for each of the six operational sequences of the A/D converter system.

As shown in FIG. 5(a) during cycle 1 which is the compensating circuit configuration amplifiers 30 and 34 are connected as grounded voltage followers with the result that the output voltage of each of is:

$$V = \frac{A}{A-1} E_{os}$$

where A is the open loop gain and $E_{os}$ is the offset voltage. Where $A >> 1$, $V \simeq E_{os}$. Also, during cycle 1 the compensating capacitor 32 is connected between the outputs of amplifiers 30 and 34 such that it is charged to a voltage equal to the difference between the two offsets, or $$V_{AB} = E_{ios} - E_{Bos}$$

where $E_{ios}$ and $E_{Bos}$ are the offset voltages of the integrator amplifier 34 and the buffer amplifier 30. Connecting the integrator as a voltage follower discharges the integrating capacitor 38 which automatically zero sets the integrator. FIG. 2 shows that integrating capacitor 38 is discharged during cycle 1 by closing switch S11. In the preferred embodiment when counter 20 reaches a full count of 2,000 at a time shown as $T_1$ in FIG. 4, cycle 1 is terminated, the counter 20 is reset to zero by a counter reset pulse from latch and counter reset unit 14, and cycle 2 is initiated. The integrator output voltage $V_O$ during cycle 1 equals $E_{ios}$ as is shown by waveform 60 of FIG. 4.

Figure 5B:
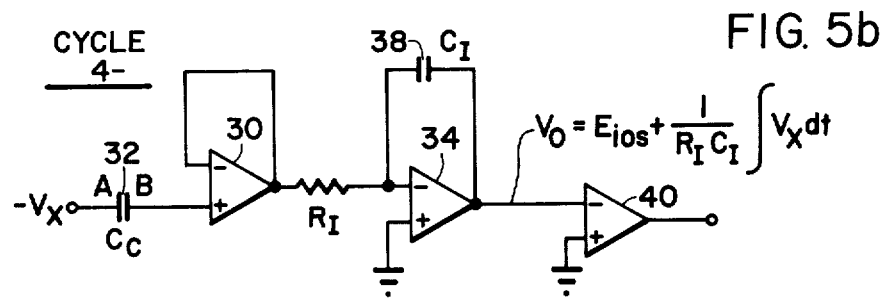
Figure 5C:
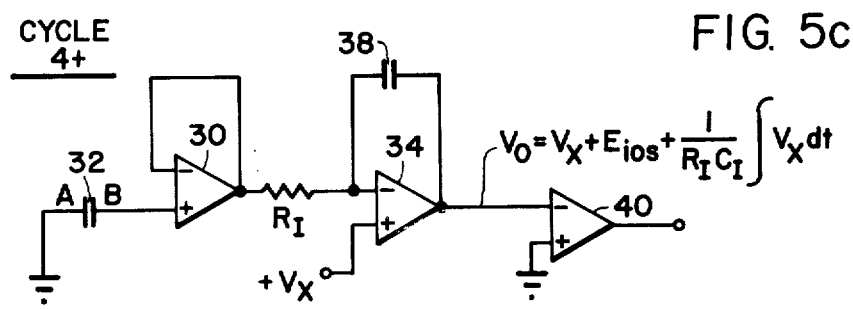
Figure 5D:
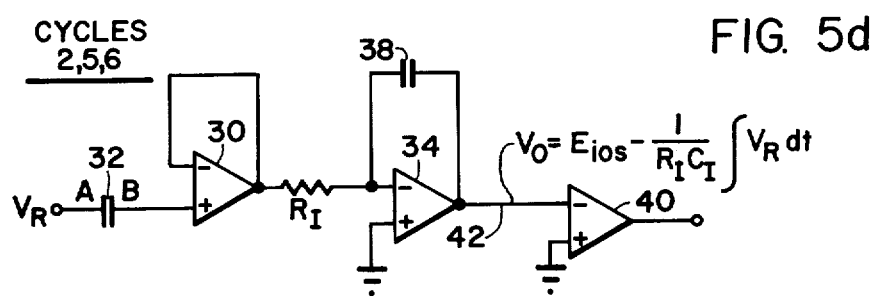

The function of cycle 2 is to allow the offset compensated buffered integrator circuit arrangement shown in FIG. 5(d) to integrate the reference voltage $V_R$ which is present on one terminal of compensating capacitor 32 while the counter 20 is simultaneously counting from an initial zero state. This integration continues until the integrator output voltage $V_O$ at 42 equals the comparator threshold voltage $E_{cos}$. When $V_O = E_{cos}$ the comparator 40 inverts its output state and produces the comparator pulse shown in FIG. 4 at reference number 62. At this time the digital content of the counter 20 is caused to be strobed into the storage latches 22 by a signal from the sequence logic unit 12, the counter 20 is reset to zero, cycle 2 is terminated and cycle 3 is initiated. During cycle 2 the output $V_O$ of the buffered, offset compensated integrator is:

$$V_O = E_{ios} - \frac{1}{R_I C_I} \int [V_R + (E_{ios} - E_{Bos}) + E_{Bos} - E_{ios}] dt$$

or $$V_O = E_{ios} - \frac{1}{R_I C_I} \int V_R dt$$

The purpose of cycle 2 is to exactly determine the magnitude of the voltage quantity ($E_{ios} - E_{cos}$) by measuring the time required to integrate from $E_{ios}$ to $E_{cos}$ while the reference voltage $V_R$ is applied to the circuit shown in FIG. 5(d). This exact representation of the difference between the integrator offset voltage $E_{ios}$ and the comparator threshold voltage $E_{cos}$ is stored digitally in the storage latches 22 at the end of cycle 2 so that it can be used at a later time to compensate for errors due to offset voltages. The fact that the integral in the equation shown above is negative imposes an important design constraint: $E_{cos}$ must always be more negative than $E_{ios}$. This requirement is met easily by intentionally unbalancing the differential input stage of the comparator 40.

The circuit configuration during cycle 3 is shown in FIG. 5(a) and the circuit operation is an exact repetition of cycle 1. Cycle 3 is terminated by the completion of a full count by counter 20 at which point counter 20 is reset and cycle 4 is initiated. The unknown input voltage $V_X$ to the A/D converter can be either positive or negative. The system will not only measure the magnitude of the input voltage $V_X$ but will also determine and indicate its polarity.

Let us assume first that the unknown input voltage is negative and is represented by $-V_X$. Let us assume also that in the immediately preceding A/D conversion the input signal had a negative polarity. If this is true, the A/D converter will make the logical assumption that the present input voltage also is negative, as a result of which the linear subsystem 10 would operate in the cycle 4— configuration shown in FIG. 5(b) during timing cycle 4. In this configuration the offset compensated integrator output $V_O$ is:

$$V_O = E_{ios} - \frac{1}{R_I C_I} \int -V_X dt$$

$$V_O = E_{ios} + \frac{1}{R_I C_I} \int V_X dt$$

The integrator output voltage $V_O$ during cycle 4 for a $-V_X$ input polarity is shown by the portion of waveform 60 lying beneath the $-V_X$ designation shown for cycle 4 of FIG. 4. The $-V_X$ input voltage is applied to one of the terminals of compensating capacitor 32 as is indicated in FIG. 5(b). This integration continues until counter 20 reaches a full count after a time $T_1$. At this point the counter 20 is reset and cycle 5 is initiated.

In the alternative, if the unknown input signal during the immediately preceding A/D conversion had been a positive voltage represented by $+V_X$, the autopolarity feature of the A/D converter system would have caused the linear subsystem 10 to be configured in the manner shown in FIG. 5(c). In this configuration the unknown input voltage is coupled to the noninverting input of amplifier 34 and one terminal of compensating capacitor 32 is grounded. The offset compensated integrator output voltage is displaced by $V_X$ according to the equation:

$$V_O = V_X + E_{ios} + \frac{1}{R_I C_I} \int V_X dt$$

As can be seen, the cycle 4 equation for a positive input signal is exactly the same as the equation for a negative input signal except that the equation for the positive input signal is offset by $V_X$. For the 4+ configuration at the beginning of cycle 4 waveform 60 shifts up along path 64 to a level $V_X$ above the level of $E_{ios}$. The slope of the integrator output is exactly the same as it was for the cycle 4— configuration if the magnitudes of $-V_X$ and $+V_X$ are equal. At the completion of timing cycle 4 the integrator output voltage $V_O$ is shifted down along path 66 so that the voltage $V_O$ is now at the same point that it would have been had a negative polarity input signal of equal magnitude been present. This condition is indicative of the fact that if the magnitudes of $-V_X$ and of $+V_X$ were equal, the voltages on the integrating capacitor 38 at the termination of the integration during cycle 4 would be equal for the circuit configurations shown in FIG. 5(b) and FIG. 5(c).

Cycle 5 is the same for either input signal polarity. The purpose of cycle 5 is to integrate the offset compensated reference voltage $V_R$ until the content of the counter 20 equals the count contained in the storage latches 22 from cycle 2. This is in effect subtracting the difference between the integrator offset voltage and the comparator threshold voltage from the voltage which was on the integrating capacitor 38 at the end of cycle 4 so that the absolute voltage of the unknown input signal can be measured during cycle 6. The slope of the integrator output waveform during cycle 5 is identical to the slope of the waveform during cycle 2 since during both cycle 2 and cycle 5 the reference voltage $V_R$ is applied to the integrator capacitor 38. A time $T_{Ecos}$ was required during cycle 2 to reduce the integrator output voltage $V_O$ from $E_{ios}$ to $E_{cos}$. Therefore, during cycle 5 an identical time $T_{Ecos}$ is also required. During cycle 5 when the counter 20 reaches this state the coincidence unit 24 senses that the count contained in the storage latches 22 coincides with that contained in counter 20. At this point a coincidence pulse is generated by coincidence unit 24 as is shown in the lower part of FIG. 4. This coincidence pulse causes the counter 20 to be reset to zero which terminates cycle 5 but allows the integration to continue without interruption into cycle 6. During cycle 5 and 6 the voltage to which the integrating capacitor 38 had been charged during cycle 4 is removed by the negative going integration of the reference voltage $V_R$.

Integration during cycle 6 continues until the threshold voltage $E_{cos}$ of comparator 40 is reached at location 70 on waveform 60. At this point the comparator 40 changes state producing the comparator pulse shown at reference number 72 in the lower part of FIG. 4. At this time the content of counter 20 which had been reset at the start of cycle 6 at point 68 along waveform 60 is strobed into the output storage display unit 26. This latter output is equivalent to the digital output of a single A/D conversion. It is a simple matter of logic circuit design to present this output in whatever format (such as parallel or multiplex) is desired. Cycle 6 can be terminated either by the triggering of the comparator 40 which would occur at location 70 along waveform 60 or by completion of a full count after a time $T_1$ into cycle 6 which would occur at location 74 on waveform 60. The latter method was used in the preferred embodiment of the invention.

For each successive A/D conversion cycle the input signal polarity is assumed logically to be the same as it had been for the preceding conversion cycle and the appropriate configuration of cycle 4 is used. If this assumption is incorrect for a particular input voltage the circuit will be configured such that rather than ramping positively as should be done during cycle 4 the integrator will ramp negatively during cycle 4. This condition would be caused by the fact that the integral in both equations (1) and (2) above would be of a negative polarity rather than the desired positive polarity. Sometime during cycle 4 or cycle 5 the integrator output voltage $V_O$ will become more negative than the comparator threshold $E_{cos}$ which will cause the comparator 40 to change state. The waveform indicated by reference number 76 indicates an incorrect polarity relationship. At reference number 78 where $V_O = E_{cos}$ a comparator pulse will be generated. Any time that a comparator pulse is generated during timing cycles 4 or 5 before the coincidence pulse has occurred the autopolarity unit 16 will sense that an incorrect configuration exists in the A/D converter. The conversion cycle will be terminated and during the succeeding conversion the cycle 4 circuit arrangement will be reversed. This readily available criterion allows the autopolarity function to be realized very simply in the present system.

It will be apparent to those skilled in the art that the disclosed A/D converter can be modified in numerous ways and may assume many embodiments other than the preferred form specifically set out and described above. For example, although the system was designed for integration on an all CMOSFET IC it can be used with equal effectiveness using other technologies (such as JFETs) which provide adequately high op amp input resistance and low shunt leakage currents in analog switches. Furthermore, the system can be designed with no change in system configuration to provide any desired output digital code (such as BCD or binary) or format (such as parallel or multiplex). The A/D converter also can be designed to provide any desired degree of resolution other than the 3½ digit, or greater, resolution described, although useful resolution will be limited by component-generated noise. Accordingly, it is intended by the appended claims to cover all such modifications of the invention which fall within the true spirit and scope of the invention.

What is claimed is:

1. In an apparatus for converting an analog input signal into digital output signals an input means comprising:
   (a) a buffer amplifier;
   (b) an integrator including an integrating capacitor wherein the output of said buffer amplifier is selectively coupled to one terminal of said integrator;
   (c) a compensating capacitor;
   (d) a voltage comparator coupled to the output of said integrator; and
   (e) switch means selectively interposed between said buffer amplifier, said integrator, said voltage comparator, said compensating capacitor and said integrating capacitor for operating said input means in a plurality of analog modes, including:
   (f) a first mode in which said compensating capacitor is charged to a voltage level representative of a function of the offset error voltages of said buffer and said integrator;
   (g) a second mode in which a reference signal is integrated from the offset error voltage of said integrator to the threshold voltage of said comparator and the time required for said integration is stored in storage means connected to said input means;
   (h) a third mode in which said compensating capacitor is recharged to a voltage level representative of a function of the offset error voltage of said buffer and said integrator;
   (i) a fourth mode in which the analog input signal is integrated for a predetermined period of time;
   (j) a fifth mode in which the reference signal is integrated for a time corresponding to the time required for the integration of the reference signal from the offset error voltage of said integrator to the threshold voltage of said comparator;
   (k) a sixth mode in which the reference signal is further integrated until the comparator threshold voltage is reached; and
   (l) whereby the measured time is converted into digital output signals representative of the magnitude of the analog input signal.

* * * * *